United States Patent
Zhao

(10) Patent No.: US 11,387,303 B2
(45) Date of Patent: Jul. 12, 2022

(54) DISPLAY PANEL AND DISPLAY DEVICE

(71) Applicant: WUHAN CHINA STAR OPTOELECTRONICS SEMICONDUCTOR DISPLAY TECHNOLOGY CO., LTD., Hubei (CN)

(72) Inventor: Jinrong Zhao, Hubei (CN)

(73) Assignee: WUHAN CHINA STAR OPTOELECTRONICS SEMICONDUCTOR DISPLAY TECHNOLOGY CO., LTD., Wuhan (CN)

(*) Notice: Subject to any disclaimer, the term of this patent is extended or adjusted under 35 U.S.C. 154(b) by 119 days.

(21) Appl. No.: 17/051,185

(22) PCT Filed: Jun. 12, 2020

(86) PCT No.: PCT/CN2020/095836
§ 371 (c)(1),
(2) Date: Oct. 28, 2020

(87) PCT Pub. No.: WO2021/217801
PCT Pub. Date: Nov. 4, 2021

(65) Prior Publication Data
US 2021/0335947 A1 Oct. 28, 2021

(30) Foreign Application Priority Data
Apr. 27, 2020 (CN) .......................... 202010345572.9

(51) Int. Cl.
H01L 27/32 (2006.01)

(52) U.S. Cl.
CPC .. *H01L 27/3258* (2013.01); *H01L 2251/5338* (2013.01)

(58) Field of Classification Search
CPC ............. H01L 27/1248; H01L 27/3258; H01L 2251/5338
See application file for complete search history.

(56) References Cited

U.S. PATENT DOCUMENTS 9,786,727 B2 * 10/2017 Cheng ................. H01L 27/3246
2016/0118451 A1 * 4/2016 Youn ................. H01L 29/78603
257/66

(Continued)

FOREIGN PATENT DOCUMENTS

CN 107302012 A 10/2017
CN 107579171 A 1/2018

(Continued)

*Primary Examiner* — Bryan R Junge
(74) *Attorney, Agent, or Firm* — The Roy Gross Law Firm, LLC; Roy Gross

(57) ABSTRACT

A display panel and a display device are provided. The display panel includes: a substrate, the substrate includes a plurality of pixel areas; a functional device layer, the functional device layer is disposed on the substrate; a plurality of via holes, the via holes are positioned on the functional device layer, and each of the via holes corresponds to one said first area; an organic layer, the organic layer is disposed on the functional device layer, and a portion of the organic layer extends into the via holes; a plurality of light emitting units; wherein, the via holes are positioned along an edge of a second area.

17 Claims, 3 Drawing Sheets

(56) References Cited

U.S. PATENT DOCUMENTS

| | | |
|---|---|---|
| 2019/0013369 A1 | 1/2019 | Bu et al. |
| 2019/0363266 A1* | 11/2019 | Tanaka .................. H01L 27/322 |
| 2020/0152904 A1* | 5/2020 | Xu ........................ H01L 27/326 |
| 2020/0176720 A1 | 6/2020 | Bu |
| 2020/0219950 A1 | 7/2020 | Huang et al. |
| 2020/0310493 A1* | 10/2020 | Kim ...................... G06F 1/1652 |
| 2020/0312931 A1 | 10/2020 | Ou et al. |

FOREIGN PATENT DOCUMENTS

| | | |
|---|---|---|
| CN | 108550612 A | 9/2018 |
| CN | 108878502 A | 11/2018 |
| CN | 109148531 A | 1/2019 |
| CN | 109494313 A | 3/2019 |
| CN | 110047381 A | 7/2019 |
| CN | 110649079 A | 1/2020 |

* cited by examiner

DISPLAY PANEL AND DISPLAY DEVICE

FIELD OF INVENTION

The present disclosure relates to the field of display technologies, and more particularly, to a display panel and a display device.

BACKGROUND OF INVENTION

At present, organic light emitting displays (OLED) are more and more widely used in wearable devices, due to their low power consumption and flexible characteristics.

In order to meet reliability requirements of flexible OLEDs, the flexible OLEDs need to undergo repeated dynamic folding tests. However, during a continuous bending process, the film layers in the flexible OLEDs are prone to fracture, thereby reducing the reliability of the flexible OLEDs.

Technical Problems

The technical problem mainly solved by the present disclosure is that during the continuous bending process, the film layers in the flexible OLEDs are prone to fracture, thereby reducing the reliability of the flexible OLEDs.

SUMMARY OF INVENTION

Technical Solutions

The embodiments of the present disclosure provide a display panel and a display device, which can improve the bending capability of the display panel, thereby increasing the product yield of the display panel.

In the first aspect, the present disclosure provides a display panel, including: a substrate, the substrate including a plurality of pixel areas, and each of the pixel areas including a first area and a second area which surrounds the first area; a functional device layer, the functional device layer being disposed on the substrate; a plurality of via holes, the via holes being positioned on the functional device layer, and the via holes being correspondingly positioned in the first area; an organic layer, the organic layer being disposed on the functional device layer, and a portion of the organic layer extending into the via holes; a plurality of light emitting units, the light emitting units being disposed on the organic layer, and the light emitting units corresponding to the second area; wherein, the via holes are positioned along an edge of the second area, material of the organic layer is organic photoresist, the display panel further includes a pixel define layer, each of the light emitting units includes an anode, a light emitting layer and a cathode, the anode is disposed on a planarization layer, the pixel define layer is disposed on the planarization layer and covers a part of the anode, and the light-emitting layer and the cathode are disposed on the anode in sequence.

In the display panel provided in the present disclosure, the functional device layer includes a buffer layer, a semiconductor layer, a gate insulating layer, a gate layer, a second insulating layer, an interlayer insulating layer, a source-drain layer, and the planarization layer that are sequentially stacked on the substrate; wherein the light emitting units are disposed on the planarization layer, the via holes are positioned on the buffer layer, and the via holes pass through the interlayer insulating layer and the gate insulating layer.

In the display panel provided in the present disclosure, the semiconductor layer includes a plurality of channel patterns; wherein a gap is provided between adjacent ones of the channel patterns, and the via holes extend into the gap.

In the display panel provided in the present disclosure, the first area includes a central area and an edge area which surrounds the central area, and the via holes include a first sub-via-hole and a plurality of second sub-via-holes; wherein the first sub-via-hole is correspondingly positioned on the central area, the plurality of second sub-via-holes surround the first sub-via hole, and the plurality of second sub-via-holes are positioned around the edge of the first sub-via-hole.

In the display panel provided in the present disclosure, the first area includes a central area and an edge area which surrounds the central area; wherein some of the via holes are correspondingly positioned in the central area, the other via holes are correspondingly positioned on the edge area, and the via holes positioned in the edge area are positioned along the edge of the second area.

In the display panel provided in the present disclosure, the plurality of via holes are arranged in an array.

In the display panel provided in the present disclosure, a shape of the second area is adapted to a shape of the via holes.

In the second aspect, the present disclosure provides a display panel, including: a substrate, the substrate including a plurality of pixel areas, and each of the pixel areas including a first area and a second area which surrounds the first area; a functional device layer, the functional device layer being disposed on the substrate; a plurality of via holes, the via holes being positioned on the functional device layer, and the via holes being correspondingly positioned in the first area; an organic layer, the organic layer being disposed on the functional device layer, and a portion of the organic layer extending into the via holes; a plurality of light emitting units, the light emitting units being disposed on the organic layer, and the light emitting units corresponding to the second area; wherein, the via holes are positioned along the edge of the second area.

In the display panel provided in the present disclosure, the functional device layer includes a buffer layer, a semiconductor layer, a gate insulating layer, a gate layer, a second insulating layer, an interlayer insulating layer, a source-drain layer, and a planarization layer that are sequentially stacked on the substrate; wherein the light emitting units are disposed on the planarization layer, the via holes are positioned on the buffer layer, and the via holes pass through the interlayer insulating layer and the gate insulating layer.

In the display panel provided in the present disclosure, the semiconductor layer includes a plurality of channel patterns; wherein a gap is provided between adjacent ones of the channel patterns, and the via holes extend into the gap.

In the display panel provided in the present disclosure, the first area includes a central area and an edge area which surrounds the central area, and the via holes include a first sub-via-hole and a plurality of second sub-via-holes; wherein the first sub-via-hole is correspondingly positioned on the central area, the plurality of second sub-via-holes surround the first sub-via hole, and the plurality of second sub-via-holes are positioned around the edge of the first sub-via-hole.

In the display panel provided in the present disclosure, the first area includes a central area and an edge area which surrounds the central area; wherein some of the via holes are correspondingly positioned in the central area, the other via holes are correspondingly positioned on the edge area, and the via holes positioned in the edge area are positioned along the edge of the second area.

In the display panel provided in the present disclosure, the plurality of via holes are arranged in an array.

In the display panel provided in the present disclosure, a shape of the second area is adapted to a shape of the via holes.

In the display panel provided in the present disclosure, material of the organic layer is organic photoresist.

In the display panel provided in the present disclosure, the display panel further includes a pixel define layer, each of the light emitting units include an anode, a light emitting layer and a cathode; wherein the anode is disposed on the planarization layer, the pixel define layer is disposed on the planarization layer and covers a part of the anode, and the light-emitting layer and the cathode are disposed on the anode in sequence.

In a third aspect, the present disclosure further provides n display device, which includes the display panel provided by any embodiment of the present disclosure.

The display panel and the display device provided by the present disclosure includes: a substrate, the substrate including a plurality of pixel areas, and each of the pixel areas including a first area and a second area which surrounds the first area; a functional device layer, the functional device layer being disposed on the substrate; a plurality of via holes, the via holes being positioned on the functional device layer, and the via holes being correspondingly positioned in the first area; an organic layer, the organic layer being disposed on the functional device layer, and a portion of the organic layer extending into the via holes; a plurality of light emitting units, the light emitting units being disposed on the organic layer, and the light emitting units corresponding to the second area; wherein, the via holes are positioned along the edge of the second area. The via holes in the display panel of the present disclosure are positioned along the edge of the second area, so that the via holes can be filled with more organic layers; therefore, the bending ability of the display panel can be improved, thereby increasing the product yield of the display panel.

Beneficial Effect

The via holes in the display panel of the present disclosure are positioned along the edge of the second area, so that the via holes can be filled with more organic layers; therefore, the bending ability of the display panel can be improved, thereby increasing the product yield of the display panel.

DESCRIPTION OF DRAWINGS

In order to more clearly illustrate the technical solutions in the embodiments or the prior art, the following drawings, which are intended to be used in the description of the embodiments or the prior art, will be briefly described. It is obvious that the drawings and the following description are only some embodiments of the present disclosure. Those of ordinary skill in the art may, without creative efforts, derive other drawings from these drawings.

DETAILED DESCRIPTION OF PREFERRED EMBODIMENTS

Figure 1:
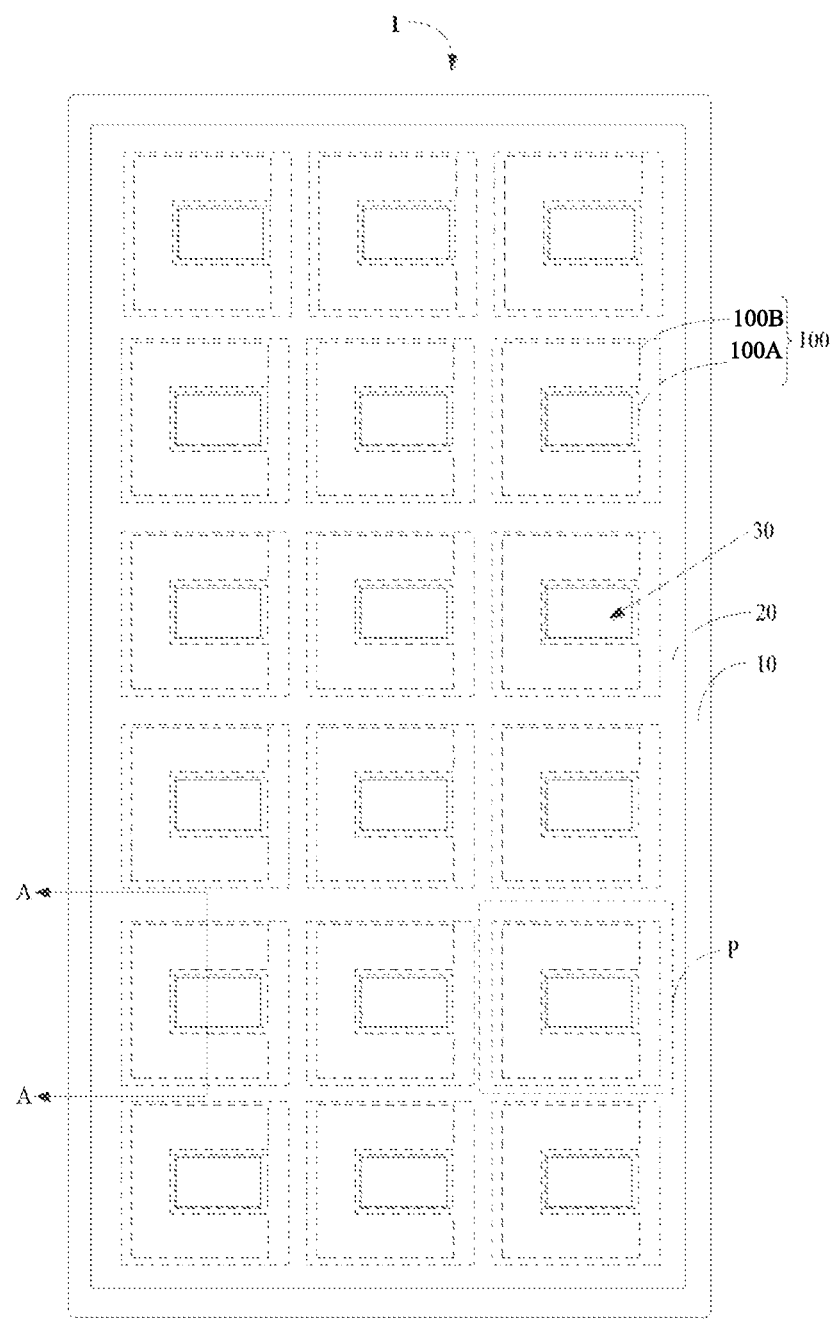
FIG. 1 is a schematic plan view of a display panel provided by an embodiment of this disclosure.

The embodiments of the present disclosure are described in detail below, and the examples of the embodiments are shown in the drawings, in which the same or similar reference numerals indicate the same or similar elements or elements having the same or similar functions throughout. The embodiments described below with reference to the drawings are exemplary, and are only used to illustrate the present disclosure, and cannot be construed as limiting the present disclosure.

Figure 2:
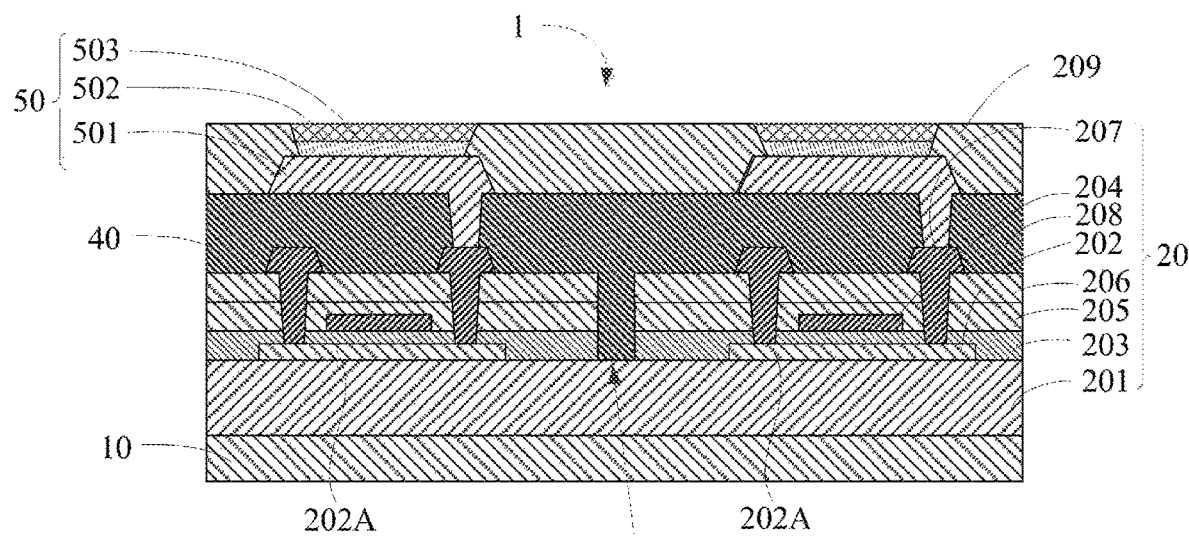
FIG. 2 is a schematic cross-sectional view of the display panel of FIG. 1 along line AA.

Refer to FIG. 1 and FIG. 2. FIG. 1 is a schematic plan view of a display panel provided by an embodiment of the present disclosure, and FIG. 2 is a schematic cross-sectional view of the display panel of FIG. 1 along line AA.

An embodiment of the present disclosure provides a display panel 1, which includes a substrate 10, a functional device layer 20, a plurality of via holes 30, an organic layer 40, and a plurality of light-emitting units 50, wherein the substrate 10 includes a plurality of pixel areas 100, and each of the pixel areas includes a first area 100A and a second area 100B which surrounds the first area 100A. The functional device layer 20 is disposed on the substrate 10, the via holes 30 is correspondingly positioned in the first area 100A, the organic layer 40 is disposed on the functional device layer 20, and a portion of the organic layer extends into the via holes 30. The light emitting units 50 are disposed on the organic layer 40, and the light emitting units 50 correspond to the second area 100B, wherein the via holes 30 are positioned along the edge of the second area 100B. It can be understood that in the embodiment of the present disclosure, one via hole 30 may correspond to one first area 100A, and the shape of the via hole 30 may be adapted to the shape of the second area 100B, so that the via holes 30 may be provided with more organic layers 40. When the display panel 1 is bent, the via holes 30 can be used to absorb the stress generated during bending; therefore, the bending ability of the display panel 1 can be provided, thereby increasing the product yield of the display panel.

Further, refer to FIG. 2. The functional device layer 20 includes a buffer layer 201, a semiconductor layer 202, a gate insulating layer 203, a gate layer 204, a second insulating layer 205, and an interlayer insulation layer 206, a source-drain layer 207, and a planarization layer 208 that are sequentially stacked on the substrate 10, wherein the light emitting units 50 are disposed on the planarization layer 208, the via holes 30 are positioned on the buffer layer 201, and the via holes 50 pass through the interlayer insulating layer 206 and the planarization layer 208. It should be noted that a plurality of light-emitting units 50 may be disposed on the planarization layer 208, and each of the light-emitting units 50 corresponds to one second area 100B. When the display panel 1 is bent, the via holes 30 can be used to absorb the stress generated during bending; therefore, the bending ability of the display panel 1 can be provided, thereby increasing the product yield of the display panel.

In some embodiments, the display panel 1 may further include a pixel define layer 209, and each of the light emitting units 50 includes an anode 501, a light emitting layer 502, and a cathode 503, wherein the anode 501 is disposed on the planarization layer 208, and the pixel define layer 209 is disposed on the planarization layer 208 and covers a part of the anode 501. The light emitting layer 502 and the cathode 503 are disposed on the anode 501 in sequence.

In some embodiments, the semiconductor layer 202 includes a plurality of channel patterns 202A, a gap is provided between adjacent ones of the channel patterns, and the via holes extend into the gap.

Figure 3:
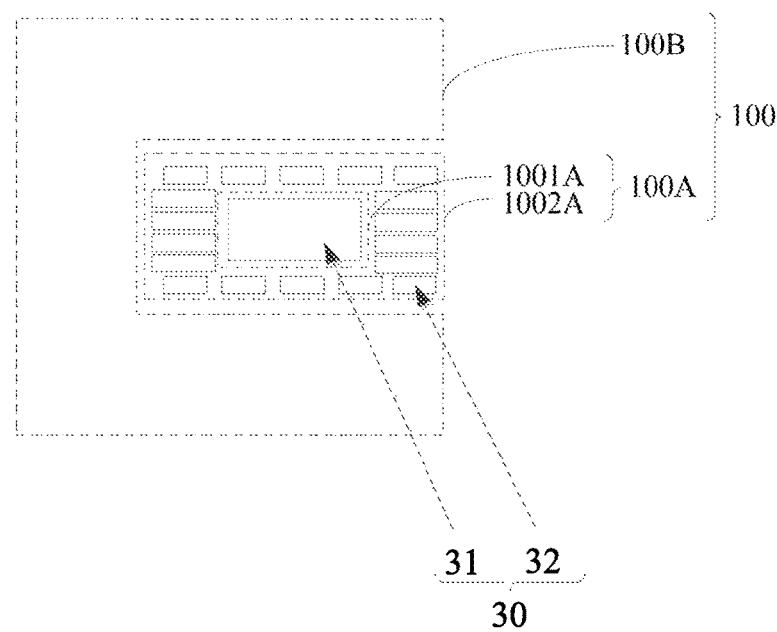
FIG. 3 is an enlarged schematic view of the first implementation of a P area of the display panel of FIG. 1.

Refer to FIG. 3. FIG. 3 is an enlarged schematic view of the first implementation of a P area of the display panel of FIG. 1. The present disclosure also provides a display panel 1. The difference between the display panel 1 shown in FIG. 3 and the display panel 1 shown in FIG. 1 is: the first area 100A includes a central area 1001A and an edge area 1002A which surrounds the central area 1001A. Each of the via holes 30 include a first sub-via-hole 31 which is correspondingly positioned in the central area 1001A, and a plurality of second sub-via-holes 32 which are correspondingly positioned in the edge area 1002A. The plurality of second sub-via-holes are positioned around the edge of the first sub-via-hole.

When the display panel 1 is bent, the first sub-via-hole 31 which is positioned in the central area 1001A, and the plurality of second sub-via-holes 32 which are correspondingly positioned in the edge area 1002A can be used to absorb the stress generated during bending; therefore, the bending ability of the display panel 1 can be provided, thereby increasing the product yield of the display panel.

Figure 4:
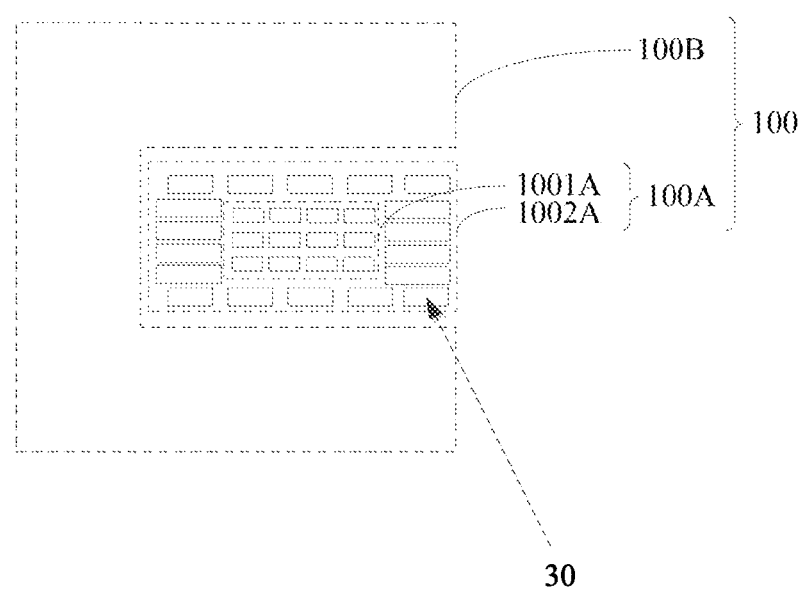
FIG. 4 is an enlarged schematic view of the second implementation of the P area of the display panel of FIG. 1.

Refer to FIG. 4. FIG. 4 is an enlarged schematic view of the second implementation of the display panel P area of FIG. 1. The present disclosure also provides a display panel 1. The difference between the display panel 1 shown in FIG. 4 and the display shown in FIG. 1 is: the first area 100A includes a central area 1001A and an edge area 1002A which surrounds the central area 1001A. Some of the via holes 30 are correspondingly positioned in the central area 1001A, and the others via holes 30 are correspondingly positioned in the edge area 1002A. The via holes 30 positioned in the edge area 1002A are positioned along the edge of the second area 100B. When the display panel 1 is bent, the via holes 30 which are positioned in the central area 1001A and the via holes 30 which are correspondingly positioned in the edge area 1002A can be used to absorb the stress generated during bending; therefore, the bending ability of the display panel 1 can be provided, thereby increasing the product yield of the display panel.

In some embodiments, the plurality of via holes are arranged in an array.

In some embodiments, the shape of the second area 100B is adapted to the shapes of the via holes 50.

In some embodiments, material of the organic layer 40 is organic photoresist.

Correspondingly, the present disclosure also provides a display device, which includes the display panel 1 of any embodiment of the present disclosure. Refer to the previous embodiments for specific details, which are not repeated herein.

A display panel and a display device provided by the embodiments of the present disclosure are introduced in detail above. Specific examples are applied to set forth the principles and implementation of the present disclosure herein. The above descriptions of the embodiments are only used to help understand the present disclosure. At the same time, for those skilled in the art, according to the ideas of the present disclosure, there will be changes in the specific implementation and application scope. In summary, the content of this specification should not be construed as limiting the present disclosure.

What is claimed is:

1. A display panel, comprising:
a substrate, the substrate including a plurality of pixel areas, and each of the pixel areas including a first area and a second area which surrounds the first area;
a functional device layer, the functional device layer being disposed on the substrate;
a plurality of via holes, the via holes being positioned on the functional device layer, and the via holes being correspondingly positioned in the first area;
an organic layer, the organic layer being disposed on the functional device layer, and a portion of the organic layer extending into the via holes;
a plurality of light emitting units, the light emitting units being disposed on the organic layer, and the light emitting units corresponding to the second area;
wherein, the via holes are positioned along an edge of the second area, material of the organic layer is organic photoresist, the display panel further includes a pixel define layer, each of the light emitting units includes an anode, a light emitting layer and a cathode, the anode is disposed on a planarization layer, the pixel define layer is disposed on the planarization layer and covers a part of the anode, and the light-emitting layer and the cathode are disposed on the anode in sequence.

2. The display panel according to claim 1, wherein the functional device layer includes a buffer layer, a semiconductor layer, a gate insulating layer, a gate layer, a second insulating layer, an interlayer insulating layer, a source-drain layer, and the planarization layer that are sequentially stacked on the substrate;
the light emitting units are disposed on the planarization layer, the via holes are positioned on the buffer layer, and the via holes pass through the interlayer insulating layer and the gate insulating layer.

3. The display panel according to claim 2, wherein the semiconductor layer includes a plurality of channel patterns;
a gap is provided between adjacent ones of the channel patterns, and the via holes extend into the gap.

4. The display panel according to claim 3, wherein the first area includes a central area and an edge area which surrounds the central area, and the via holes include a first sub-via-hole and a plurality of second sub-via-holes;
the first sub-via-hole is correspondingly positioned in the central area, the plurality of second sub-via-holes surround the first sub-via hole, and the plurality of second sub-via-holes are positioned around the edge of the first sub-via-hole.

5. The display panel according to claim 3, wherein the first area includes a central area and an edge area which surrounds the central area;
some of the via holes are correspondingly positioned in the central area, the other via holes are correspondingly positioned in the edge area, and the via holes positioned on the edge area are positioned along the edge of the second area.

6. The display panel according to claim 3, wherein the plurality of via holes are arranged in an array.

7. The display panel according to claim 1, wherein a shape of the second area is adapted to a shape of the via holes.

8. A display panel, comprising:
a substrate, the substrate including a plurality of pixel areas, and each of the pixel areas including a first area and a second area which surrounds the first area;
a functional device layer, the functional device layer being disposed on the substrate;

a plurality of via holes, the via holes being positioned on the functional device layer, and the via holes being correspondingly positioned in the first area;

an organic layer, the organic layer being disposed on the functional device layer, and a portion of the organic layer extending into the via holes;

a plurality of light emitting units, the light emitting units being disposed on the organic layer, and the light emitting units corresponding to the second area;

wherein, the via holes are positioned along the edge of the second area.

9. The display panel according to claim 8, wherein the functional device layer includes a buffer layer, a semiconductor layer, a gate insulating layer, a gate layer, a second insulating layer, an interlayer insulating layer, a source-drain layer, and a planarization layer that are sequentially stacked on the substrate;

the light emitting units are disposed on the planarization layer, the via holes are positioned on the buffer layer, and the via holes pass through the interlayer insulating layer and the gate insulating layer.

10. The display panel according to claim 9, wherein the semiconductor layer includes a plurality of channel patterns;

a gap is provided between adjacent ones of the channel patterns, and the via holes extend into the gap.

11. The display panel according to claim 10, wherein the first area includes a central area and an edge area which surrounds the central area, and the via holes include a first sub-via-hole and a plurality of second sub-via-holes;

the first sub-via-hole is correspondingly positioned in the central area, the plurality of second sub-via-holes surround the first sub-via hole, and the plurality of second sub-via-holes are positioned around the edge of the first sub-via-hole.

12. The display panel according to claim 10, wherein the first area includes a central area and an edge area which surrounds the central area;

some of the via holes are correspondingly positioned in the central area, the other via holes are correspondingly positioned in the edge area, and the via holes positioned on the edge area are positioned along the edge of the second area.

13. The display panel according to claim 10, wherein the plurality of via holes are arranged in an array.

14. The display panel according to claim 8, wherein a shape of the second area is adapted to a shape of the via holes.

15. The display panel according to claim 8, wherein material of the organic layer is organic photoresist.

16. The display panel according to claim 9, wherein the display panel further includes a pixel define layer, each of the light emitting units include an anode, a light emitting layer and a cathode; wherein the anode is disposed on the planarization layer, the pixel define layer is disposed on the planarization layer and covers a part of the anode, and the light-emitting layer and the cathode are disposed on the anode in sequence.

17. A display device comprising a display panel, the display panel comprising:

a substrate, the substrate including a plurality of pixel areas, and each of the pixel areas including a first area and a second area which surrounds the first area;

a functional device layer, the functional device layer being disposed on the substrate;

a plurality of via holes, the via holes being positioned on the functional device layer, and the via holes being correspondingly positioned in the first area;

an organic layer, the organic layer being disposed on the functional device layer, and a portion of the organic layer extending into the via holes;

a plurality of light emitting units, the light emitting units being disposed on the organic layer, and the light emitting units corresponding to the second area;

wherein, the via holes are positioned along the edge of the second area.

* * * * *